(12) United States Patent
Haramoto

(10) Patent No.: US 7,625,499 B2
(45) Date of Patent: Dec. 1, 2009

(54) CONDUCTIVE LIQUID-CRYSTAL MATERIAL, PROCESS FOR PRODUCING THE SAME, LIQUID-CRYSTAL COMPOSITION, LIQUID CRYSTAL SEMICONDUCTOR ELEMENT, AND INFORMATION MEMORY MEDIUM

(75) Inventor: Yuichiro Haramoto, Kofu (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 203 days.

(21) Appl. No.: 11/792,421

(22) PCT Filed: Nov. 30, 2005

(86) PCT No.: PCT/JP2005/021953

§ 371 (c)(1),
(2), (4) Date: Jun. 6, 2007

(87) PCT Pub. No.: WO2006/062014

PCT Pub. Date: Jun. 15, 2006

(65) Prior Publication Data

US 2008/0087867 A1 Apr. 17, 2008

(30) Foreign Application Priority Data

| Dec. 7, 2004 | (JP) | ............................. 2004-354744 |
| May 13, 2005 | (JP) | ............................. 2005-140800 |
| Aug. 5, 2005 | (JP) | ............................. 2005-228674 |

(51) Int. Cl.
 *C09K 19/52* (2006.01)
(52) U.S. Cl. .................. 252/299.01; 428/1.1; 428/1.25; 568/629; 568/631; 568/646; 568/648; 568/654; 568/660
(58) Field of Classification Search .............. 252/299.1; 568/629, 631, 646, 648, 654, 660; 428/1.1, 428/1.25
See application file for complete search history.

(56) References Cited

U.S. PATENT DOCUMENTS

| 5,145,546 | A | * | 9/1992 | Yuasa et al. .................. 156/324 |
| 5,766,510 | A | * | 6/1998 | Hanna et al. ........... 252/299.62 |
| 6,224,787 | B1 | * | 5/2001 | Hanna et al. ............. 252/299.3 |
| 2005/0179366 | A1 | * | 8/2005 | Rose et al. .................. 313/503 |
| 2006/0255318 | A1 | * | 11/2006 | Haramoto ................. 252/299.3 |
| 2006/0278848 | A1 | * | 12/2006 | Haramoto ............. 252/299.01 |

OTHER PUBLICATIONS

Vacuum-Deposited Submonolayer Thin Films of a Three-Ring Bent-Core Compound, Tang et al. J. Phys. Chem. B, 2004, 108 (34), p. 12921-12926.*
JP 2005-142233 machine translation.*
Zerban et al., "Synthesis, Liquid Crystals and Photochemistry of Di- and Tristyrylbenzenes with Alkoxy SideChains, Z. Naturforsh. B", 1993, 48 (2), p. 171-184.
Mates et al., "Model Polymers with Distryrylbenzene Segments for Third-Order Nonlinear Optical Properties", ACS Symp. Ser., 1991, 455, pp. 497-513.
Barbera et al., "A Study of The Structure-Mesomorphism Relationship In Some Polymers And Low-Molecular-Weight Model Compounds"; Eur.Polym. J., 1990, 26 (11), pp. 1259-1265.
Haramoto et al., "New possibility for an organic semiconductor: a smectic liquid crystalline semiconductor having a long conjugated core and two long alkyl chains, Liquid Cyrstal", Jul. 2005, 32 (7), pp. 909-912.
International Search Report of PCT/JP2005/021953, date of mailing Feb. 28, 2006.

* cited by examiner

*Primary Examiner*—Harold Y. Pyon
*Assistant Examiner*—Haidung D Nguyen
(74) *Attorney, Agent, or Firm*—Westerman, Hattori, Daniels & Adrian, LLP

(57) ABSTRACT

The present invention provides a conductive liquid-crystal material having features including that, for example, excellent conductivity is exhibited at a low threshold voltage of about 5 V even in a room temperature range, the value of resistance varies with an applied voltage, the current density rises sharply at a voltage of about 5 V, and an excellent charge mobility is exhibited, as well as a process for producing the conductive liquid-crystal material, a liquid-crystal composition which is used for the conductive liquid-crystal material, a liquid-crystal semiconductor element, and an information recording medium.

The conductive liquid-crystal material is characterized by being a liquid-crystal composition composed of at least two components having a smectic phase as a liquid-crystal phase, wherein at least one component is selected from distyryl derivatives represented by the following general formula (1) and the liquid-crystal composition comes into a solid state formed by a phase transition from the smectic phase.

(1)

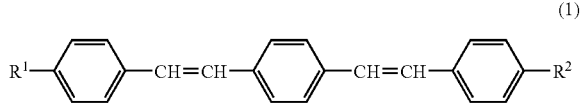

(In the formula, $R^1$ and $R^2$ independently represent a linear or branched alkyl group or an alkoxyl group, and $R^1$ and $R^2$ may be the same group or different groups.)

16 Claims, 9 Drawing Sheets

[Fig. 1]
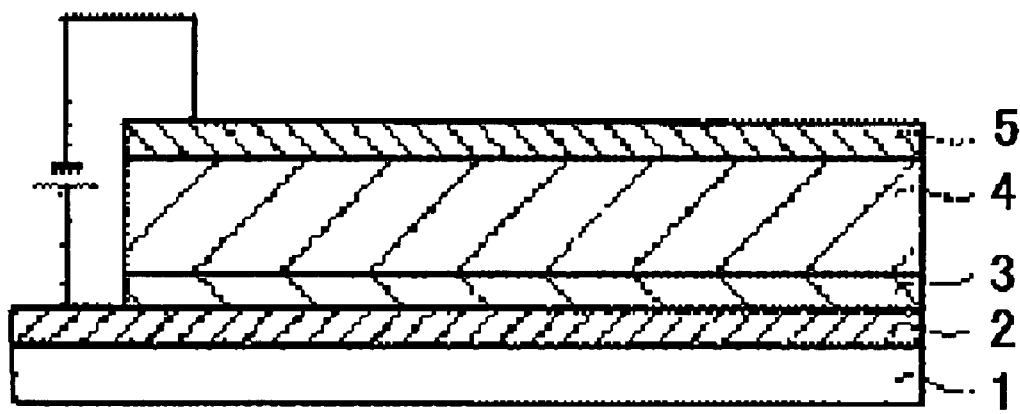

[Fig. 2]
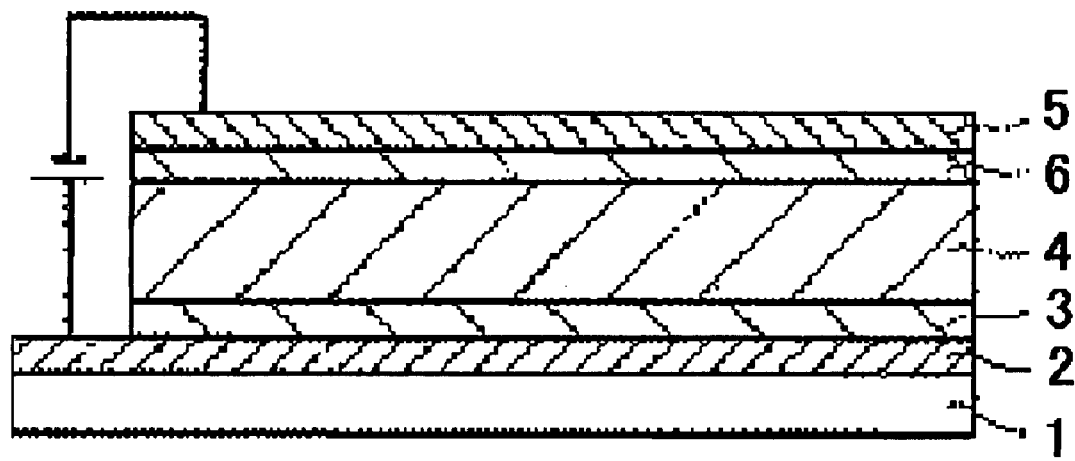

[Fig. 3]
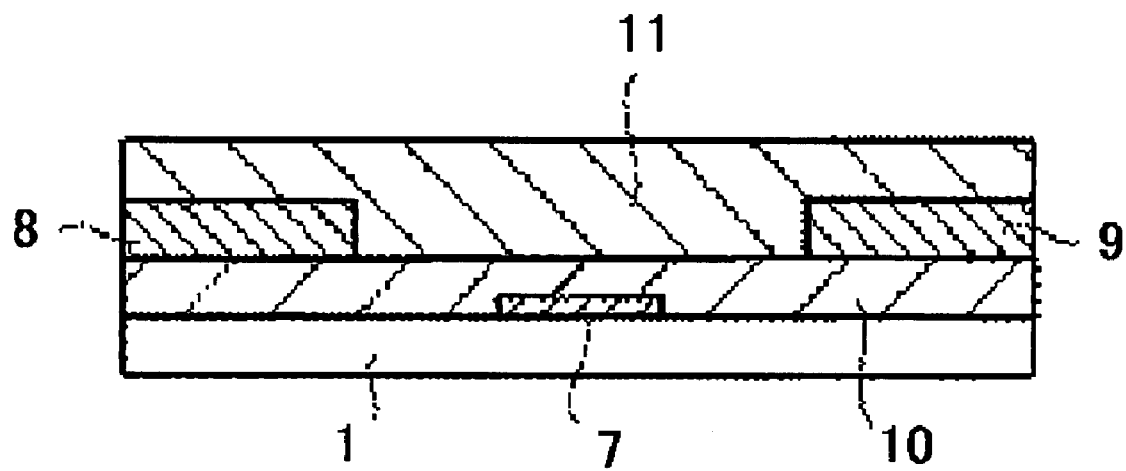

[Fig. 4]
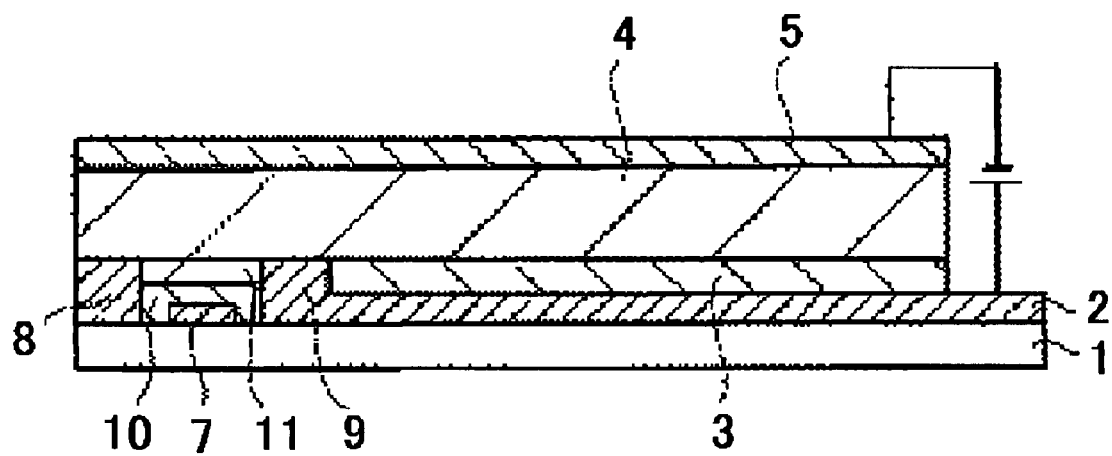

[Fig. 5]
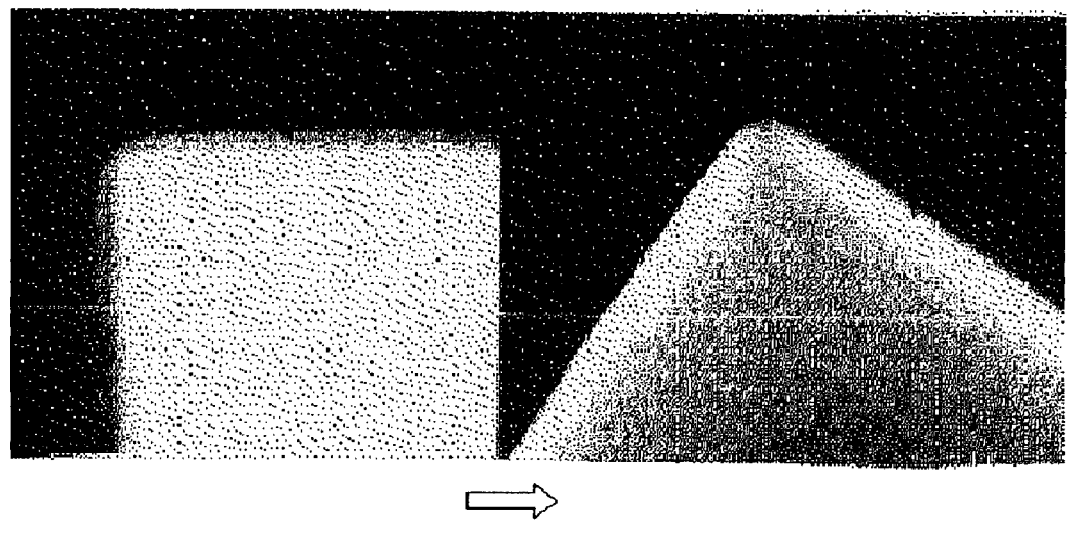
45° ROTATION

[Fig. 6]
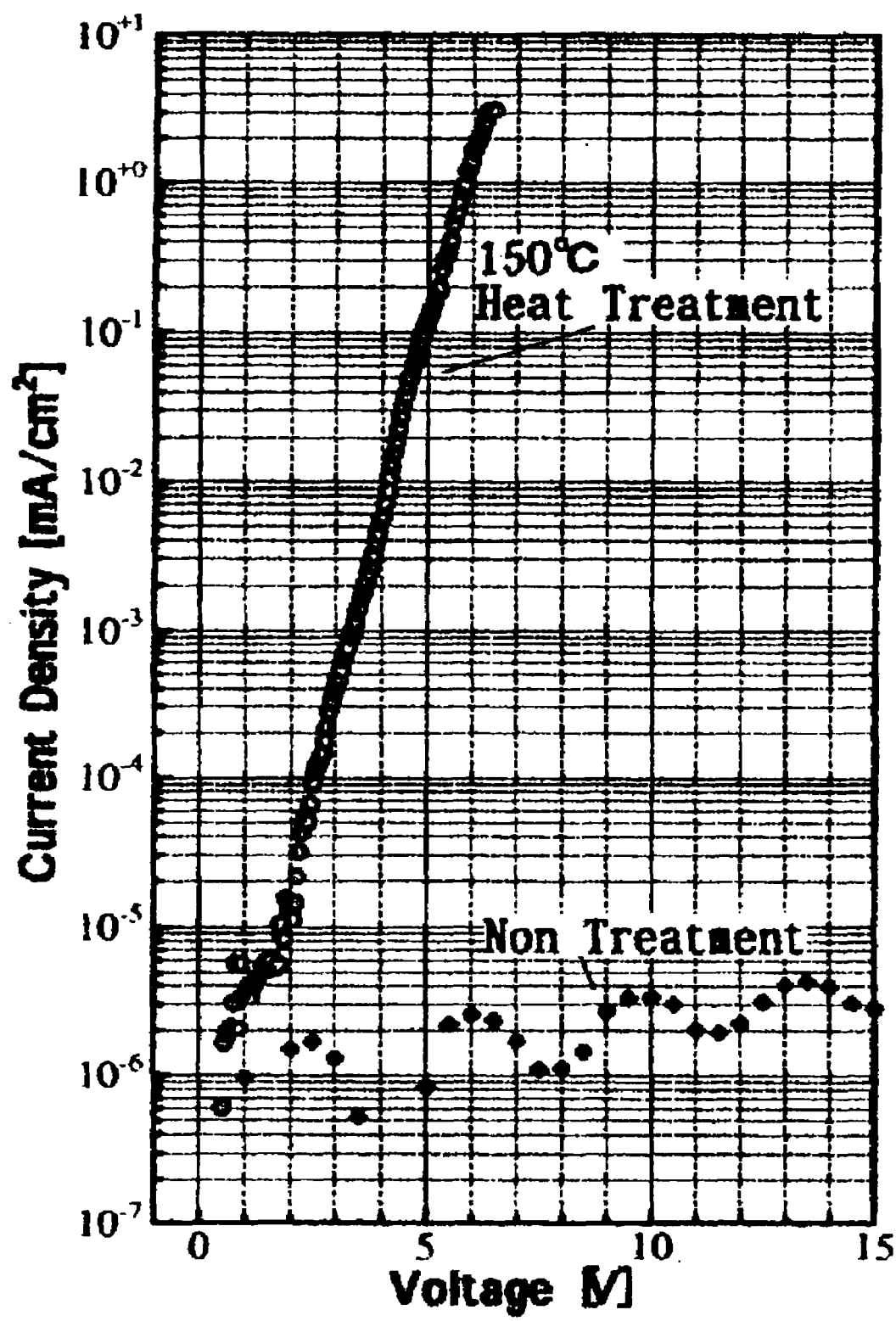

[Fig. 7]
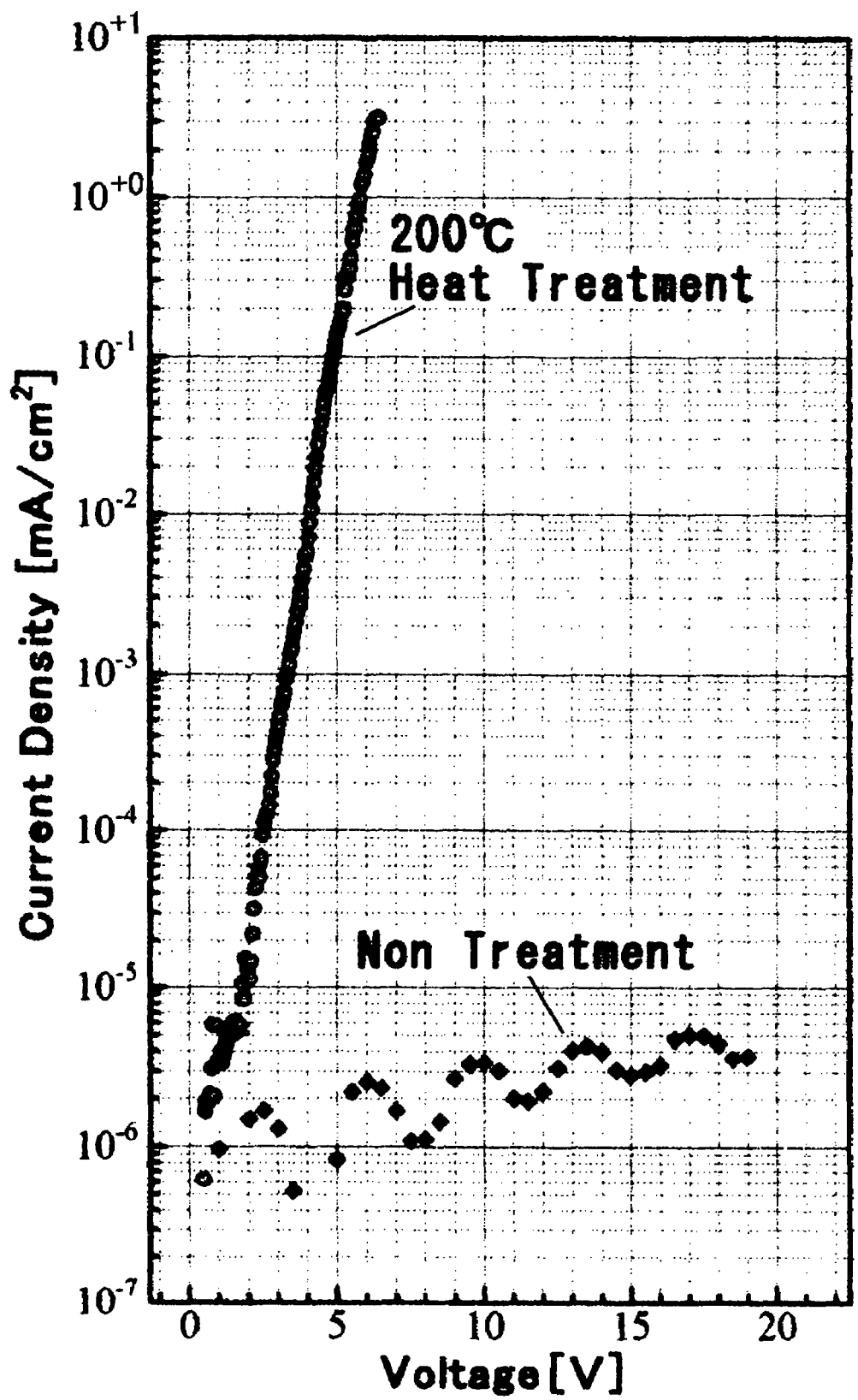

[Fig. 8]
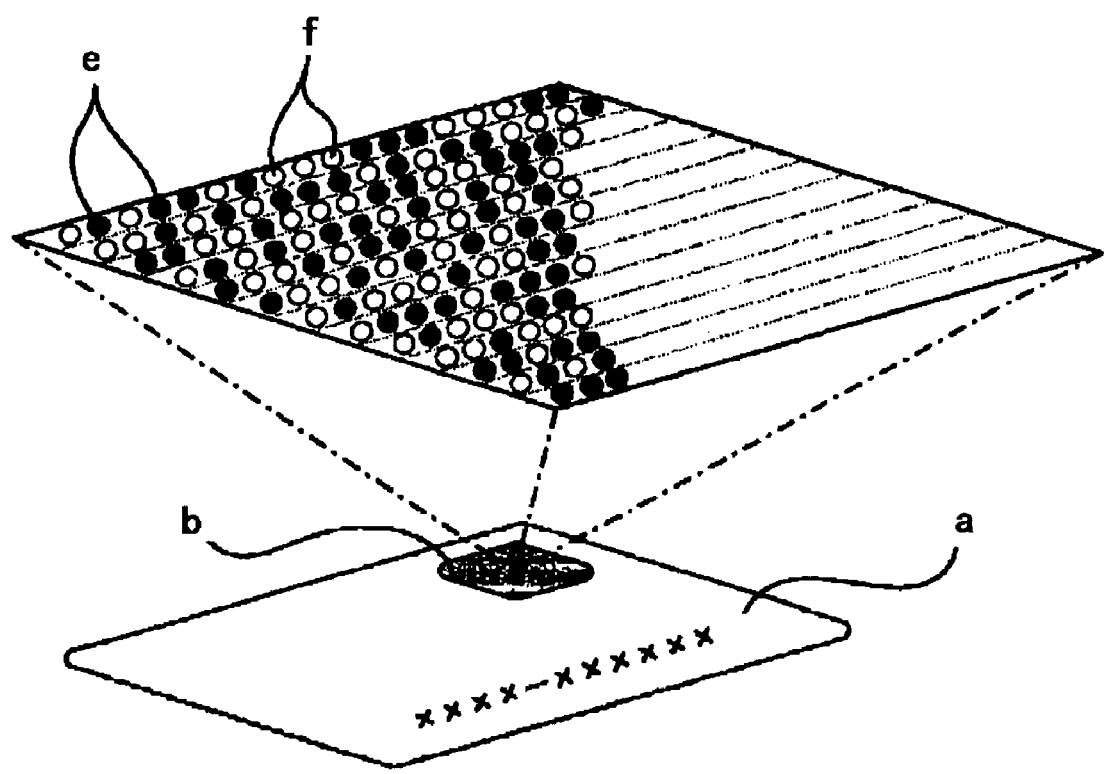

[Fig. 9]
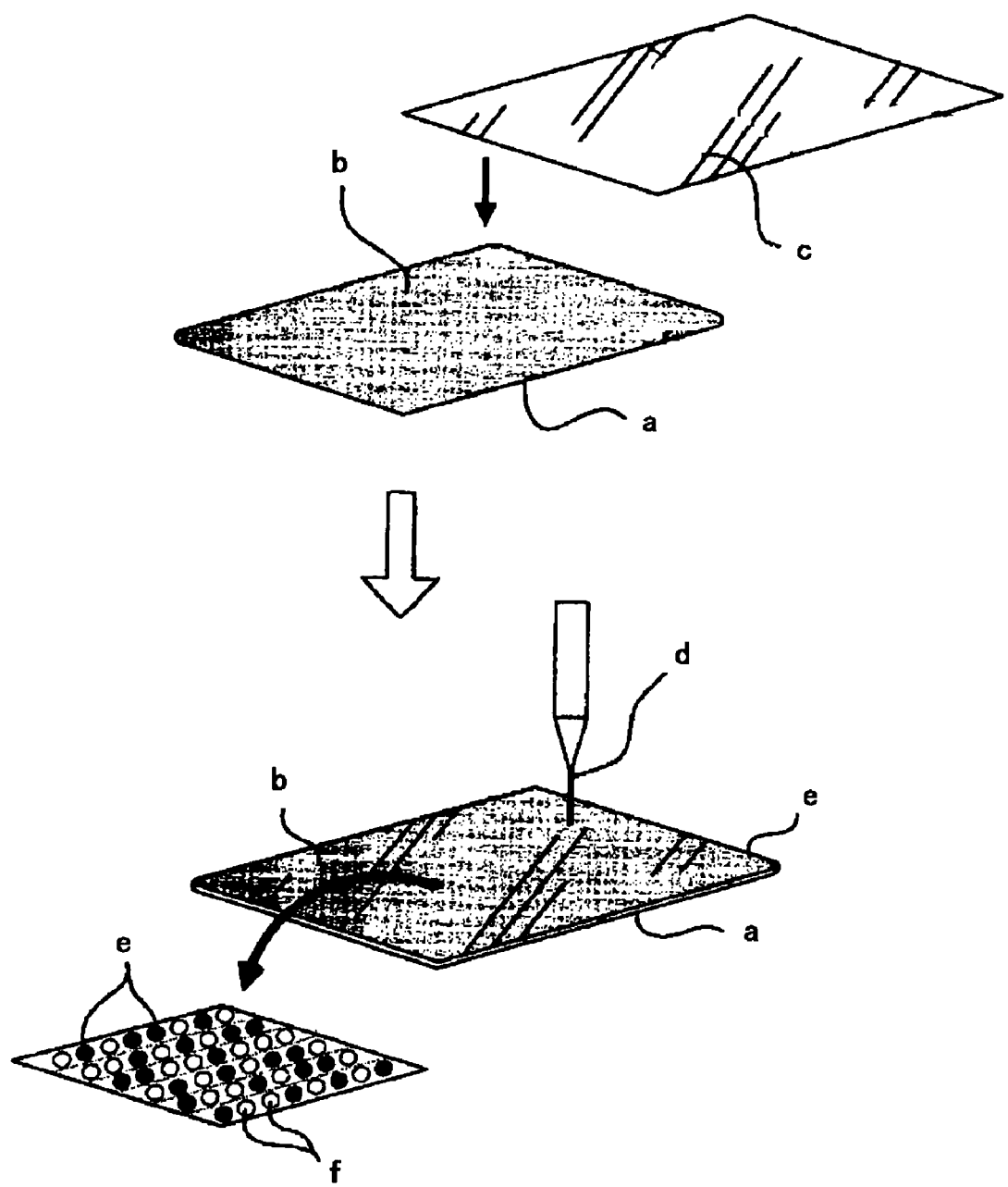

CONDUCTIVE LIQUID-CRYSTAL MATERIAL, PROCESS FOR PRODUCING THE SAME, LIQUID-CRYSTAL COMPOSITION, LIQUID CRYSTAL SEMICONDUCTOR ELEMENT, AND INFORMATION MEMORY MEDIUM

TECHNICAL FIELD

The present invention relates to a conductive liquid-crystal material having features including that, for example, the threshold value is a low about 5 V even in a room temperature range, excellent conductivity is exhibited, the value of resistance varies with an applied voltage, the current density rises sharply at a voltage of about 5 V, and an excellent charge mobility is exhibited, as well as a process for producing the conductive liquid-crystal material, a liquid-crystal composition which is used for the conductive liquid-crystal material, a liquid-crystal semiconductor element including the conductive liquid-crystal material, and an information memory medium including the above-described liquid-crystal composition.

BACKGROUND ART

In recent years, research has been conducted actively on organic electroluminescent elements including organic materials as hole transport materials or charge transport materials constituting electroluminescent elements. Previously, compounds, e.g., anthracene derivatives, anthraquinoline derivatives, imidazole derivatives, styryl derivatives, hydrazone derivatives, triphenylamine compounds, poly-N-vinylcarbazole, and oxadiazole, are known as such a charge transport material.

Liquid-crystal compounds have been applied as display materials to various apparatuses. For example, liquid-crystal compounds are used in watches, electronic calculators, televisions, personal computers, cellular phones, and the like. Liquid-crystal substances are classified into thermotropic liquid crystals (temperature transition type liquid crystals) and lyotropic liquid crystals (concentration transition type liquid crystals) on the basis of the means for effecting the phase transition. These liquid crystals are classified into three types, smectic liquid crystals, nematic liquid crystals, and cholesteric liquid crystals, from the view point of the molecular arrangement. The liquid crystal is also known as an anisotropic liquid, and exhibits optical anisotropy similar to that of an optically uniaxial crystal. The orthoscopic observation is the observation with common crossed Nicols, and is useful for the discrimination of the types of liquid crystal and the determination of transition temperature of a liquid-crystal phase. Each liquid crystal exhibits a characteristic birefringent optical pattern under this observation, and the smectic liquid crystal is further classified into A, B, C, D, E, F, G, and the like.

Hanna et al. have proposed charge transport materials including liquid-crystal compounds having charge transport capability, wherein a liquid-crystal phase has a smectic phase. For example, a liquid-crystal charge transport material exhibiting smectic liquid-crystal property and having a reduction potential within the range of −0.3 to −0.6 (V vs. SEC) relative to a standard reference electrode (SCE) (refer to Patent Document 1), a liquid-crystal charge transport material in which a liquid crystal compounds having a self orientation property and exhibiting a smectic phase is blended with a predetermined amount of fulleren C70 having a sensitization function (refer to Patent Document 2), a liquid-crystal charge transport material dispersion type polymer film in which a liquid-crystal compound exhibiting a smectic phase is contained in a organic polymer matrix (refer to Patent Document 3), a liquid-crystal charge transport material in which a mixture containing a smectic liquid-crystal compound is contained (refer to Patent Document 4), a liquid-crystal charge transport material exhibiting a smectic liquid-crystal property and having an electron mobility or hole mobility velocity of $1 \times 10^{-5}$ cm²/v·s or more (refer to Patent Document 5), a liquid-crystal charge transport material containing a smectic liquid-crystal compound including a functional group capable of forming a new intermolecular or intramolecular bond and a functional group having a hole and/or electron transport property in a molecule (refer to Patent Document 6), and the like have been proposed.

With respect to the smectic liquid-crystal compound proposed as described above, the charge transport is performed in a smectic A phase liquid-crystal state by using a smectic liquid-crystal compound having a 6π-electron system aromatic ring, e.g., a benzene ring, a pyridine ring, pyrimidine ring, a pyridazine ring, a pyrazine ring, or a tropolone ring; a 10π-electron system aromatic, e.g., a naphthalene ring, an azulene ring, a benzofuran ring, an indole ring, an indazole ring, a benzothiazole ring, a benzoxazole ring, a benzimidazole ring, a quinoline ring, an isoquinoline ring, a quinazoline ring, or a quinoxaline ring; or a 14π-electron system aromatic ring, e.g., a phenantone ring or anthracene. However, the above-described charge transport method requires photoexcitation, and the conductivity thereof was $10^{-13}$ s/cm without photoexcitation and $10^{-11}$ s/cm even with photoexcitation, which were values in a region of an insulating material.

In order to solve these problems, the inventors of the present invention proposed previously distyryl based compounds having a specific structure including a smectic phase as a liquid-crystal phase, the distyryl based compounds serving as liquid-crystal compounds exhibiting excellent conductivity without photoexcitation (for example, refer to Patent Documents 8 to 10) and, furthermore, proposed organic electroluminescent elements and thin film transistors including the distyryl based compounds (refer to Patent Document 11).

Patent Document 1: Japanese Unexamined Patent Application Publication No. 09-316442

Patent Document 2: Japanese Unexamined Patent Application Publication No. 11-162648

Patent Document 3: Japanese Unexamined Patent Application Publication No. 11-172118

Patent Document 4: Japanese Unexamined Patent Application Publication No. 11-199871

Patent Document 5: Japanese Unexamined Patent Application Publication No. 10-312711

Patent Document 6: Japanese Unexamined Patent Application Publication No. 11-209761

Patent Document 7: Japanese Unexamined Patent Application Publication No. 2001-351786

Patent Document 8: Japanese Unexamined Patent Application Publication No. 2004-6271

Patent Document 9: International Patent Publication WO 2004/085360 Pamphlet

Patent Document 10: International Patent Publication WO 2004/085359 Pamphlet

Patent Document 11: Japanese Unexamined Patent Application Publication No. 2004-311182

DISCLOSURE OF INVENTION

Problems to be Solved by the Invention

However, some problems are left with respect to the conductivity in a room temperature range.

In order to overcome the above-described problems, the inventors of the present invention conducted intensive research. As a result, it was found that with respect to a liquid-crystal composition composed of at least two components having a smectic phase as a liquid-crystal phase, wherein at least one component was a distyryl derivative represented by the above-described general formula (1) having, in particular, a long-chain alkyl, memorization of the molecular arrangement of the smectic phase was significantly improved and even when the state was returned into the room temperature range, a solid state, in which the molecular arrangement of the smectic phase was almost perfectly maintained, was brought about.

Furthermore, the inventors of the present invention found that when the liquid-crystal composition in the solid state, in which the molecular arrangement of the smectic phase was almost perfectly maintained, was used, a conductive liquid-crystal material having features including that, for example, the threshold value was a low about 5 V even in a room temperature range, the conductivity was significantly improved without the requirement for photoexcitation, the value of resistance varied with an applied voltage, the current density rose sharply at a voltage of about 5 V, and an excellent charge mobility was exhibited, was produced, so that the present invention has been completed.

Accordingly, it is an object of the present invention to provide a conductive liquid-crystal material having features including that, for example, the threshold value is a low about 5 V even in a room temperature range, excellent conductivity is exhibited, the value of resistance varies with an applied voltage, the current density rises sharply at a voltage of about 5 V, and an excellent charge mobility is exhibited, as well as a process for producing the conductive liquid-crystal material, a liquid-crystal composition which is used for the conductive liquid-crystal material, a liquid-crystal semiconductor element including the conductive liquid-crystal material, a process for producing the liquid crystal semiconductor element, and an information recording medium.

Means for Solving the Problems

A conductive liquid-crystal material provided by a first aspect of the present invention is characterized by being a liquid-crystal composition composed of at least two components having a smectic phase as a liquid-crystal phase, wherein at least one component is selected from distyryl derivatives represented by the following general formula (1) and the liquid-crystal composition comes into a solid state formed by a phase transition from the smectic phase.

(1)

(In the formula, $R^1$ and $R^2$ independently represent a linear or branched alkyl group or an alkoxyl group, and $R^1$ and $R^2$ may be the same group or different groups.)

A process for producing a conductive liquid-crystal material provided by a second aspect of the present invention characterized by including the steps of heat-treating a liquid-crystal composition composed of at least two components having a smectic phase as a liquid-crystal phase, at least one component being selected from distyryl derivatives represented by the above-described general formula (1), in a temperature range suitable for a smectic liquid crystal state and, thereafter, lowering the temperature.

A liquid-crystal composition provided by a third aspect of the present invention is characterized by being composed of at least two components having a smectic phase as a liquid-crystal phase, wherein at least one component is selected from distyryl derivatives represented by the above-described general formula (1).

A liquid-crystal semiconductor element provided by a fourth aspect of the present invention is characterized by including the conductive liquid-crystal material according to the above-described first aspect of the present invention.

An information memory medium provided by a fifth aspect of the present invention is characterized by including the liquid-crystal composition according to the above-described third aspect of the present invention.

BRIEF DESCRIPTION OF THE DRAWINGS

FIG. 1 is a schematic diagram showing a cross-sectional structure of an organic electroluminescent element of an embodiment including a liquid crystal semiconductor element according to an aspect of the present invention.

FIG. 2 is a schematic diagram showing a cross-sectional structure of an organic electroluminescent element of an embodiment including a liquid crystal semiconductor element according to an aspect of the present invention.

FIG. 3 is a schematic diagram showing a cross-sectional structure of a thin film transistor element of an embodiment including a liquid crystal semiconductor element according to an aspect of the present invention.

FIG. 4 is a schematic diagram showing a cross-sectional structure of an organic electroluminescent element provided with a thin film transistor element of an embodiment including a liquid crystal semiconductor element according to an aspect of the present invention.

FIG. 5 is a polarization microscope photograph in which it is observed that the molecular arrangement of a solid state product produced by heat-treating a liquid-crystal composition according to an aspect of the present invention at 150° C. for 3 minutes, followed by natural cooling to room temperature (25° C.), is horizontally oriented relative to a substrate.

FIG. 6 is a diagram showing the relationship between the voltage and the amount of current of each of the conductive liquid-crystal material (heat-treatment at 150° C. for 3 minutes) prepared in Example 1 and the liquid-crystal composition without a heat treatment.

FIG. 7 is a diagram showing the relationship between the voltage and the amount of current of each of the conductive liquid-crystal material (heat-treatment at 200° C. for 3 minutes) prepared in Example 1 and the liquid-crystal composition without a heat treatment.

FIG. 8 is a schematic diagram of an information memory medium of an embodiment including a liquid crystal composition according to an aspect of the present invention.

FIG. 9 is a schematic diagram showing formation of spots by heat-treating a thin film composed of a liquid-crystal composition according to an aspect of the present invention with laser light.

REFERENCE NUMERALS 1 substrate
2 anode
3 buffer layer
4 conductive liquid-crystal layer
5 cathode
6 light-emitting layer
7 gate
8 source
9 drain
10 insulating film
11 channel portion
a card substrate
b thin film
c spot in a smectic liquid-crystal state
d spot in an insulation state
e protective film
f laser light

BEST MODE FOR CARRYING OUT THE INVENTION

The present invention will be described below with reference to preferred embodiments.

A conductive liquid-crystal material according to an aspect of the present invention is characterized by being a liquid-crystal composition composed of at least two components having a smectic phase as a liquid-crystal phase, wherein at least one component is selected from distyryl derivatives represented by the following general formula (1) and the liquid-crystal composition comes into a solid state formed by a phase transition from the smectic phase. The conductive liquid-crystal material according to an aspect of the present invention has the above-described configuration and, therefore, has features including that, for example, the threshold voltage is a low voltage of about 5 V even in a room temperature range, excellent conductivity is exhibited, the value of resistance varies with an applied voltage, the current density rises sharply at a voltage of about 5 V, and an excellent charge mobility is exhibited.

In the formula of distyryl derivatives represented by the above-described general formula (1), $R^1$ and $R^2$ independently represent a linear or branched alkyl group or an alkoxyl group.

Preferably, an alkyl group having the carbon number of 3 to 20 is used as the above-described alkyl group. Specific examples of alkyl groups include a butyl group, a hexyl group, a heptyl group, an octyl group, a nonyl group, a decyl group, a dodecyl group, a pentadecyl group, and an octadecyl group. In particular, when the branched alkyl group is an alkyl group represented by a general formula $CH_3-(CH_2)_x-CH(CH_3)-(CH_2)_y-CH_2-$ (in the formula, x represents an integer of 0 to 7, and y represents an integer of 0 to 7), the solubility into various solvents can be improved.

With respect to the above-described alkoxyl group represented by a general formula $C_nH_{2n+1}O-$, preferably, n in the formula is an integer of 3 to 20. In particular, when the branched alkoxyl group is an alkoxyl group represented by a general formula $CH_3-(CH_2)_x-CH(CH_3)-(CH_2)_y-CH_2-O-$ (in the formula, x represents an integer of 0 to 7, and y represents an integer of 0 to 7), the solubility into various solvents can be improved.

In the distyryl derivatives represented by the above-described general formula (1), $R^1$ and $R^2$ may be the same group or different groups. Furthermore, the distyryl derivatives represented by the above-described general formula (1) may be a cis form, a trans form, or a mixture of the two.

The distyryl derivatives represented by the above-described general formula (1) to be used for the conductive liquid-crystal material according to an aspect of the present invention can be produced by, for example, a reaction represented by the following reaction formula (1) or a reaction represented by the following reaction formula (2). According to the following reaction formula (1), the distyryl derivatives represented by the above-described general formula (1), in which $R^1$ and $R^2$ are the same group, can be advantageously produced. On the other hand, according to the following reaction formula (2), the distyryl derivatives represented by the above-described general formula (1), in which $R^1$ and $R^2$ are different groups, can be advantageously produced.

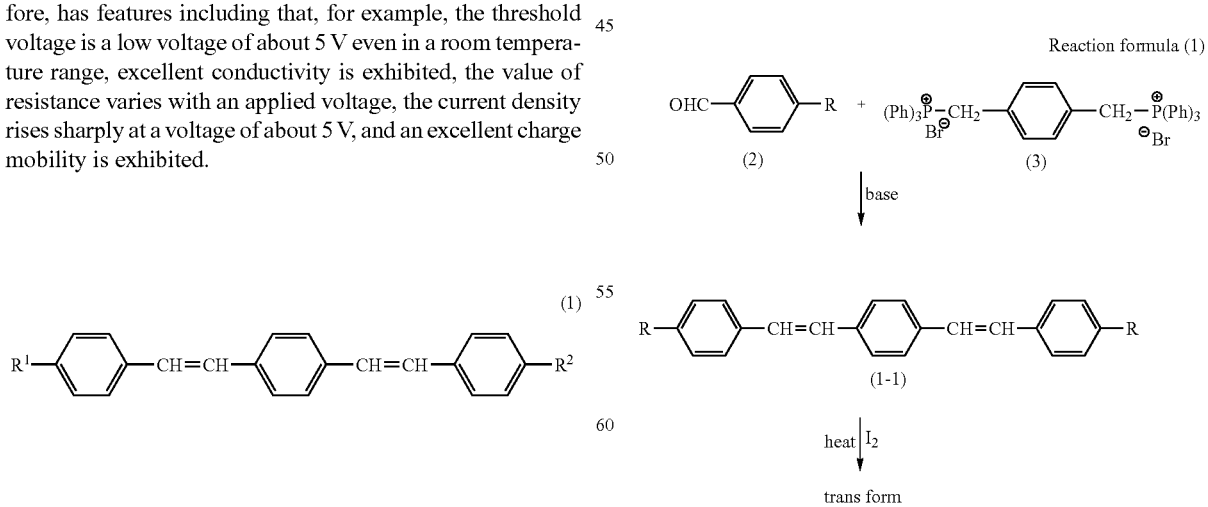

(In the formula, $R=R^1=R^2$, and $R^1$ and $R^2$ are as described above.)

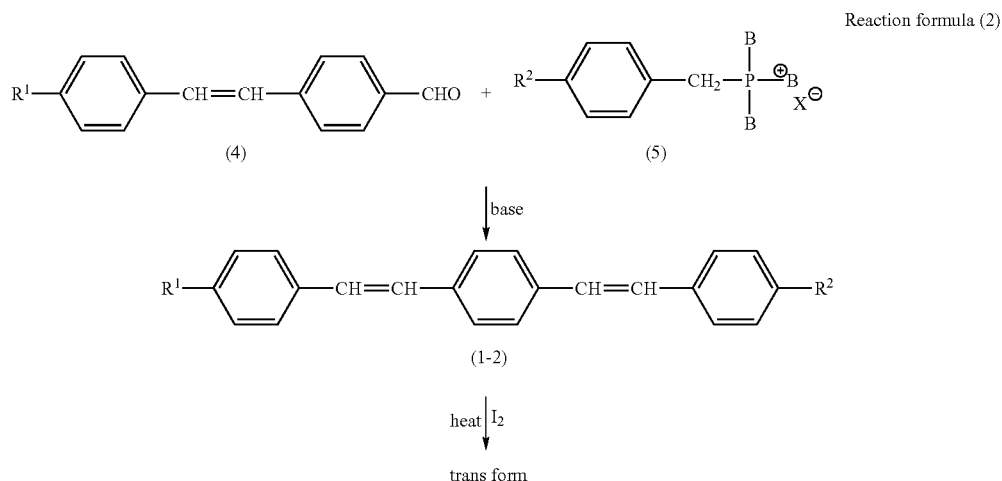

Reaction formula (2)

(In the formula, $R^1$ and $R^2$ are as described above, B represents a monovalent organic group, e.g., a methyl group, an ethyl group, or a phenyl group, and X represents a halogen atom, e.g., chlorine or bromine.)

With respect to the reaction of the above-described Reaction formula (1), specifically, the above-described benzaldehyde derivative (Compound (2)) is 2 to 4 times, preferably 2 to 2.5 times as large as p-xylenebis-(triphenylphosphonium bromide) (Compound (3)) on a mole basis, a base, e.g., an alkoxide, is 1 to 5 times, preferably 3.5 to 4.5 times as large as p-xylenebis-(triphenylphosphonium bromide) (Compound (3)) on a mole basis, and the reaction is performed in a solvent, for example, alcohol, e.g., methanol or ethanol, at 0° C. to 100° C., preferably 20° C. to 50° C. for 0.5 to 50 hours, preferably 5 to 30 hours, so that an object distyryl derivative (Compound (1-1)) represented by the above-described general formula (1) can be produced (refer to Japanese Unexamined Patent Application Publication No. 2004-6271 and International Patent Publication WO 2004/085360 Pamphlet).

On the other hand, with respect to the reaction of the above-described Reaction formula (2), specifically, the above-described phosphonium salt (Compound (5)) is 1 to 3 times, preferably 1 to 1.5 times as large as the above-described benzaldehyde derivative (Compound (4)) on a mole basis, a base, e.g., an alkoxide, is 1 to 4 times, preferably 2 to 3 times as large as the above-described benzaldehyde derivative (Compound (4)) on a mole basis, and the reaction is performed in a solvent, for example, alcohol, e.g., methanol or ethanol, at −20° C. to 50° C., preferably −5° C. to 25° C. for 1 to 20 hours, preferably 5 to 15 hours, so that an object distyryl derivative (Compound (1-2)) represented by the above-described general formula (1) can be produced (refer to International Patent Publication WO 2004/085359 Pamphlet).

Furthermore, in the reactions represented by the above-described Reaction formula (1) or Reaction formula (2), the resulting distyryl derivative (Compound (1-1, 1-2)) is heat-treated in a solvent in the presence of iodine, so that a trans form corresponding to the distyryl derivative (Compound (1-1, 1-2)) can be produced selectively. In this case, the amount of addition of iodine is 0.001 to 0.1 times, preferably 0.005 to 0.01 times as large as the distyryl derivative (Compound (1-1, 1-2)) on a mole basis, and the heat treatment temperature is 100° C. to 180° C., preferably 130° C. to 150° C. Examples of usable solvents at this time include benzene, toluene, o-xylene, m-xylene, p-xylene, chlorobenzene, o-dichlorobenzene, m-dichlorobenzene, and p-dichlorobenzene. These can be used alone or in combination.

Examples of components, which are other than the distyryl derivatives represented by the above-described general formula (1) and which are usable for the conductive liquid-crystal material according to an aspect of the present invention, include liquid-crystal compounds represented by the following general formulae (6a) to (6f) having a long linear conjugated structure portion.

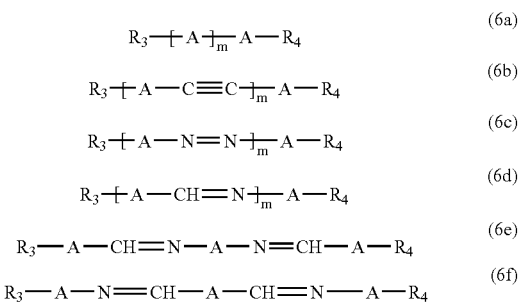

(In the formulae, m represents an integer of 1 to 3.)

In the formulae of liquid-crystal compounds represented by the above-described general formulae (6a) to (6f) having a long linear conjugated structure portion, $R_3$ and $R_4$ independently represents a linear or branched alkyl group or a linear or branched alkoxyl group. Preferably, an alkyl group having the carbon number of 3 to 20 is used as the above-described alkyl group. Specific examples of alkyl groups include a butyl group, a hexyl group, a heptyl group, an octyl group, a nonyl group, a decyl group, a dodecyl group, a pentadecyl group, and an octadecyl group. In particular, when the branched alkyl group is an alkyl group represented by a general formula $CH_3-(CH_2)_x-CH(CH_3)-(CH_2)_y-CH_2-$ (in the formula, x represents an integer of 0 to 7, and y represents an integer of 0 to 7), the solubility into various solvents can be improved. With respect to the above-described alkoxyl group represented by a general formula $C_nH_{2n+1}O-$, preferably, n in the formula is an integer of 3 to 20. In particular, when the branched alkoxyl group is an alkoxyl group represented by a general formula $CH_3-(CH_2)_x-CH(CH_3)-(CH_2)_y-CH_2-O-$ (in the formula, x represents an integer of 0 to 7, and y represents an integer of 0 to 7), the solubility into various solvents can be improved. In the formula, examples of A include groups represented by the following general formulae (7) to (11).

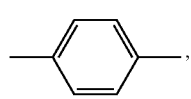 (7)

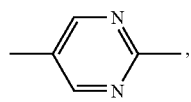 (8)

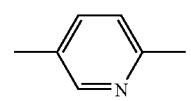 (9)

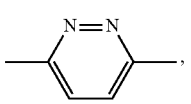 (10)

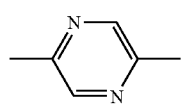 (11)

In the liquid-crystal compounds represented by the above-described general formulae (6a) to (6f) having a long linear conjugated structure portion, $R_3$ and $R_4$ may be the same group or different groups. Furthermore, the liquid-crystal compounds represented by the above-described general formulae (6a) to (6f) having a long linear conjugated structure portion may be a cis form, a trans form, or a mixture of the two.

It is preferable that the conductive liquid-crystal material according to an aspect of the present invention contains at least two components of distyryl derivatives represented by the above-described general formula (1) because a product exhibiting high conductivity can be produced particularly.

In this case, a combination of distyryl derivatives represented by the above-described general formula (1) having the lengths of alkyl chains different from each other is preferable, and an arbitrary combination of at least two compounds having the lengths of alkyl chains different from each other and having the carbon number of 3 to 18 is particularly preferable.

In the present invention, in the case where $R^1$ and $R^2$ are alkoxyl groups, the alkyl chain refers to an alkyl group portion, "$C_nH_{2n+1}$", of an alkoxyl group represented by the general formula: $C_nH_{2n+1}O-$.

With respect to the conductive liquid-crystal material according to an aspect of the present invention, it is particularly preferable that the above-described liquid-crystal composition is a composition containing a distyryl derivative (A), in which $R^1$ and $R^2$ in the formula of the distyryl derivatives represented by the above-described general formula (1) are groups selected from an alkyl group having the carbon number of 12 to 18 and an alkoxyl group represented by a general formula: $C_nH_{2n+1}O-$ (in the formula, n represents an integer of 12 to 18), and a distyryl derivative (B), in which $R^1$ and $R^2$ in the formula of the distyryl derivatives represented by the above-described general formula (1) are groups selected from an alkyl group having the carbon number of 6 to 11 and an alkoxyl group represented by a general formula: $C_nH_{2n+1}O-$ (in the formula, n represents an integer of 6 to 11).

With respect to the conductive liquid-crystal material according to an aspect of the present invention, it is particularly preferable that the above-described liquid-crystal composition exhibits a liquid-crystal phase of a smectic phase in a temperature range of 100° C. to 250° C., preferably 130° C. to 250° C., because a product exhibiting the heat resistance at a practical temperature of at least about 100° C., preferably about 130° C. and, furthermore, exhibiting high conductivity particularly in a room temperature range can be produced. Therefore, the blending ratio of the components constituting the above-described liquid-crystal composition is adjusted at will in such a way that the liquid-crystal composition exhibits a liquid-crystal phase of a smectic phase in a temperature range of 100° C. to 250° C., preferably 130° C. to 250° C. The blending ratio of each of the components is significantly different depending on the distyryl derivative to be used. For example, in the case where a distyryl derivative, in which $R^1$ and $R^2$ in the above-described general formula (1) are alkoxyl groups $C_{15}H_{31}O-$, is used as the distyryl derivative (A) and a distyryl derivative, in which $R^1$ and $R^2$ in the above-described general formula (1) are alkoxyl groups $C_{10}H_{21}O-$, is used as the distyryl derivative (B), the case being one of preferable combinations in the present invention, the molar ratio of the above-described distyryl derivative (B) to the above-described distyryl derivative (A) is 0.90 to 1.10, and preferably is 1.

The conductive liquid-crystal material according to an aspect of the present invention is a liquid-crystal composition composed of at least two components having a smectic phase as a liquid-crystal phase, wherein at least one component is selected from distyryl derivatives represented by the above-described general formula (1). The liquid-crystal composition contains at least 30 percent by weight, preferably at least 50 percent by weight, and further preferably at least 90 percent by weight of the above-described distyryl derivatives and has a liquid-crystal phase of smectic phase resulting from the distyryl derivatives.

With respect to the conductive liquid-crystal material according to an aspect of the present invention, besides the above-described components, if necessary, other components can be contained in the above-described liquid-crystal composition for the purpose of improving various properties. Examples of other components to be contained include other liquid-crystal compounds, electron-donating materials, electron-accepting materials, and light-emitting materials.

The above-described liquid-crystal composition according to an aspect of the present invention can be prepared as described below. That is, at least one type of desired components of distyryl derivatives represented by the above-described general formula (1) and other necessary components are dissolved in a solvent and, thereafter, the solvent is removed by heating, pressure reduction, or the like, so as to prepare the liquid-crystal composition. Alternatively, at least one type of desired components of distyryl derivatives represented by the above-described general formula (1) and other necessary components are mixed and heat-melted or subjected to sputtering, vacuum deposition, oblique vacuum deposition, or the like. Preferably, the liquid-crystal composition of the conductive liquid-crystal material according to an aspect of the present invention is prepared by a vacuum deposition method or an oblique vacuum deposition method among them. This is because since the state of thin film by vapor deposition is coarse, in the thin film formed by vapor deposition, liquid-crystal molecules tend to be rearranged by a heat treatment and, therefore, when the liquid-crystal composition is heat-treated and once brought into a liquid crystal state of a smectic phase, the memory of molecular arrangement in the smectic phase of the liquid crystal molecules is improved as compared with the states obtained by other production methods, and a solid state, in which the molecular arrangement in the smectic phase is almost perfectly maintained, can be obtained even when the liquid-crystal composition is returned into the room temperature range. In the case where a layer of the liquid-crystal composition according to an aspect of the present invention is formed on a desired substrate, at least one type of desired components of distyryl derivatives represented by the above-described general formula (1) and other necessary components may be dissolved in a solvent and a layer may be formed by a coating method through printing, a dip coating method, or a spin coating method. In this case, an organic thin film is produced easily, and there is an industrial advantage. Examples of the above-described printing method include a screen printing method and an ink-jet printing method, although not limited to them.

It is an important factor for the liquid-crystal composition according to an aspect of the present invention to come into a solid state formed by a phase transition from the smectic phase, in addition to being a liquid-crystal composition composed of the above-described specific components.

Here, the above-described solid state refers to a crystal phase, a glass state, or a solid of indefinite shape resulting from temperature reduction from the state of a smectic phase effected by a heat treatment of the above-described liquid-crystal composition.

The temperature, at which the above-described liquid-crystal composition is heat-treated so as to effect the smectic phase, may be within the range, in which the liquid-crystal composition itself exhibits a liquid-crystal phase of a smectic phase. However, since the preferable temperature range of the liquid-crystal phase of a smectic phase of the liquid-crystal composition to be used for the conductive liquid-crystal material according to an aspect of the present invention is 100° C. to 250° C. as described above, it is favorable that the temperature range of the heat treatment of the liquid-crystal composition is 100° C. to 250° C., preferably 130° C. to 250° C., and particularly preferably 130° C. to 180° C. from the view point of production of a product having high conductivity in a room temperature range. The time and the like of the heat treatment are not specifically limited and it is adequate that the time is 1 to 60 minutes, preferably about 1 to 10 minutes.

The speed of the above-described temperature reduction is not specifically limited, and quenching may be performed. However, when the temperature reduction is performed gradually by natural cooling or the like, a solid state, in which the maintenance factor of the molecular arrangement of the smectic phase is improved, can be ensured.

The conductive liquid-crystal material according to an aspect of the present invention is produced by heat-treating the above-described liquid-crystal composition at a temperature within the above-described range and reducing the temperature. However, when the liquid-crystal composition composed of the above-described specific components is used, the liquid-crystal compound itself has a characteristic of keeping the insulating property, and the memory of molecular arrangement in the smectic phase of the liquid crystal molecules of the liquid-crystal composition is improved significantly. When such the liquid-crystal composition is allowed to come into a solid state formed by phase transition of the smectic phase, the solid state, in which the molecular arrangement of the smectic phase was almost perfectly maintained even in the room temperature range, was brought about. Therefore, the resulting features include that, for example, the threshold voltage is a low voltage of about 5 V even in a room temperature range (20° C. to 30° C.), excellent conductivity about 10 million times or more as large as that in the case of no treatment is exhibited, the value of resistance varies with an applied voltage, the current density rises sharply at a voltage of about 5 V, and an excellent charge mobility is exhibited.

For example, the insulating property of a portion not heat-treated after vapor deposition on a substrate is seven orders of magnitude different from that of a portion heat-treated in terms of a conductivity. Therefore, the conductive liquid-crystal material according to an aspect of the present invention is used as an recording medium taking advantage of that described above, and is useful as a recording medium taking the advantage of the optical difference in molecular arrangement of the liquid crystal between the portion not heat-treated after vapor deposition on a substrate and the portion heat-treated or a liquid-crystal semiconductor element to be used for an organic electroluminescent element (EL element) or a thin film transistor element.

The liquid-crystal semiconductor element according to the fourth aspect of the present invention will be described below.

The liquid-crystal semiconductor element according to an aspect of the present invention is a liquid-crystal semiconductor element characterized by including the above-described conductive liquid-crystal material. The liquid-crystal semiconductor element is suitable for use as an organic electroluminescent element (EL element), a thin film transistor element, or an organic electroluminescent element provided with the thin film transistor.

The liquid-crystal semiconductor element according to an aspect of the present invention will be described below with reference to the drawings.

FIG. 1 to FIG. 4 are schematic diagrams showing an embodiment of the liquid-crystal semiconductor element according to an aspect of the present invention.

An element shown in FIG. 1 is produced by laminating sequentially an anode 2, a buffer layer 3, a conductive liquid-crystal layer 4, and a cathode 5 on a transparent substrate 1. This element is particularly suitable for use as an organic electroluminescent element. For the substrate 1, in general, a glass substrate or the like commonly used for the organic electroluminescent element is used. For the anode 2, a transparent material having a large work function is used in order to take out the light as necessary, and an ITO film, for example, is suitable. The cathode 5 is formed from a thin film of a metal, e.g., Al, Ca, LiF, or Mg, having a small work function or an alloy thereof.

The conductive liquid-crystal material according to an aspect of the present invention is used for the conductive liquid-crystal layer 4. Since the distyryl derivative itself has a blue light-emitting property, the conductive liquid-crystal layer 4 has a function as a light-emitting layer or a carrier transport layer. In this case, small amounts of light-emitting material can be further added within the bounds of maintaining the solid state formed by the phase transition from a smectic phase of the conductive liquid-crystal material. Examples of usable light-emitting materials include diphenylethylene derivatives, triphenylamine derivatives, diaminocarbazole derivatives, benzothiazole derivatives, benzoxazole derivatives, aromatic diamine derivatives, quinacridone based compounds, perylene based compounds, oxadiazole derivatives, coumarin based compounds, anthraquinone derivatives, dyes for lasing, e.g., DCM-1, various metal complexes, low molecular weight fluorescence dyes, and high molecular weight fluorescence materials.

With respect to the conductive liquid-crystal material according to an aspect of the present invention, it is particularly preferable that this conductive liquid-crystal layer 4 is produced by subjecting each of the components of the above-described liquid-crystal composition to vacuum deposition or oblique vacuum deposition in a room temperature range (5° C. to 40° C.) simultaneously or separately and performing a heating and orientation treatment in an atmosphere of an inert gas, e.g., nitrogen, argon, or helium, in a temperature range suitable for a smectic liquid crystal state of the liquid-crystal composition.

The buffer layer 3 is disposed, if necessary, in order to reduce the energy barrier of hole injection from the anode 2 and, for example, copper phthalocyanine, PEDOT-PSS (poly (3,4-ethylenedioxythiophene)-polystyrene sulfonate), phenylamine based compounds, starburst amine based compounds, vanadium oxide, molybdenum oxide, ruthenium oxide, aluminum oxide, amorphous carbon, polyaniline, and polythiophene derivatives are used. A buffer layer for the purpose of electron injection may be disposed on the cathode 5 side.

FIG. 2 is a schematic diagram of an element showing a preferred embodiment in the case where the liquid-crystal semiconductor element according to an aspect of the present invention is used as an organic electroluminescent element (EL element). This element is produced by laminating sequentially an anode 2, a buffer layer 3, a conductive liquid-crystal layer 4, an organic light-emitting layer 6, and a cathode 5 on a transparent substrate 1. This element is different from the element of the embodiment shown in FIG. 1 in that the light-emitting layer 6 is not the conductive liquid-crystal layer. For the light-emitting layer 6, known various organic light-emitting materials, e.g., diphenylethylene derivatives, triphenylamine derivatives, diaminocarbazole derivatives, benzothiazole derivatives, benzoxazole derivatives, aromatic diamine derivatives, quinacridone based compounds, perylene based compounds, oxadiazole derivatives, coumarin based compounds, anthraquinone derivatives, dyes for lasing, e.g., DCM-1, various metal complexes, low molecular weight fluorescence dyes, and high molecular weight fluorescence materials, are used.

In the present embodiment, the conductive liquid-crystal material according to an aspect of the present invention is used for the conductive liquid-crystal layer 4. It is preferable that this conductive liquid-crystal layer 4 is produced by subjecting each of the components of the above-described liquid-crystal composition to vacuum deposition or oblique vacuum deposition in a room temperature range (5° C. to 40° C.) simultaneously or separately and performing a heating and orientation treatment in an atmosphere of an inert gas, e.g., nitrogen, argon, or helium, in a temperature range suitable for a smectic liquid crystal state of the liquid-crystal composition.

In this case, the conductive liquid-crystal layer 4 functions mainly as a carrier transport layer. Since the carrier transport performance is higher than those of known amorphous type organic compounds, the layer thickness can be increased and, in addition, an effect of increasing an injection efficiency of the carrier so as to reduce a driving voltage can also be expected.

In these organic electroluminescent elements, the thickness of the conductive liquid-crystal layer 4 can be designed arbitrarily within the range of 100 nm to 100 μm.

FIG. 3 is a schematic diagram of an element showing a preferred embodiment in the case where the liquid-crystal semiconductor element according to an aspect of the present invention is used as a thin film transistor element. This thin film transistor (hereafter referred to as "TFT") is a field effect TFT in which a source 8 and a drain 9 are formed opposing to each other with a gate 7 therebetween on a substrate 1. An insulating film 10 is formed in such a way as to cover the gate 7, and a channel portion 11 for energizing the source 8 and the drain 9 is provided outside the insulating film 10. For the substrate 1, inorganic materials, e.g., glass and an alumina sintered material, and insulating materials, e.g., a polyimide film, a polyester film, a polyethylene film, a polyphenylene sulfide film, and a polyparaxylene film, are used. For the gate 7, organic materials, e.g., ponyaniline and polythiophene, metals, e.g., gold, platinum, chromium, palladium, aluminum, indium, molybdenum, and nickel, alloys of these metals, polysilicon, amorphous silicon, tin oxide, indium oxide, indium, tin oxide, and the like are used. Preferably, the insulating film 10 is formed by applying an organic material, and examples of organic materials to be used include polychloroprene, polyethylene terephthalate, polyoxymethylene, polyvinylchloride, polyvinylidene fluoride, cyanoethylpullulan, polymethyl methacrylate, polysulfone, polycarbonate, and polyimide. For the source 8 and the drain 9, for example, gold, platinum, and transparent conductive films (indium-tin oxide, indium-zinc oxide, and the like) are used. For the channel portion 11, the conductive liquid-crystal material according to an aspect of the present invention is used. It is preferable that the channel portion 11 is produced by subjecting each of the components of the above-described liquid-crystal composition to vacuum deposition or oblique vacuum deposition in a room temperature range (5° C. to 40° C.) simultaneously or separately and performing a heating and orientation treatment in an atmosphere of an inert gas, e.g., nitrogen, argon, or helium, in a temperature range suitable for a smectic liquid crystal state of the liquid-crystal composition. If necessary, an electron-donating material or an electron-accepting material is used in combination and, thereby, a p-type or n-type nature can be further emphasized. When an electric field is applied from the gate 7 to the channel portion 11 formed from the above-described conductive liquid-crystal material, the amount of holes or electrons in the channel portion can be controlled and a function as a switching element can be imparted. Furthermore, when a polyimide, for example, is used as a material for the insulating film 10, this is subjected to a rubbing treatment and, thereafter, a conductive liquid-crystal layer is formed as an outside layer thereof, and the orientation property of the conductive liquid-crystal layer can be further increased. In this manner, a reduction in actuation voltage of TFT and high-speed actuation can be facilitated. It is desirable that the direction of rubbing of the rubbing treatment is perpendicular to the direction of a current flow path between the source 8 and the drain 9 (for example, the direction of a line connecting the centers of the two). In this manner, a side chain portion of the liquid-crystal compound having a long linear conjugated structure portion is arranged perpendicularly to the current flow path between the source and the drain, and the conjugated core portions are oriented nearby. Therefore, the transport performance of the carrier becomes large significantly, and the conductivity at the level of a semiconductor, e.g., silicon, is exhibited.

FIG. 4 is a schematic diagram of an element showing a cross-sectional structure of an organic electroluminescent element provided with a thin film transistor element of an embodiment including a liquid crystal semiconductor element according to an aspect of the present invention.

In this element, a TFT serving as a switching element is disposed on the same substrate 1 as that of the electroluminescent element main body, and the above-described thin film transistor is used as the TFT. That is, adjacently to the electroluminescent element main body, a source 8 and a drain 9 are formed opposing to each other with a gate 7 therebetween on a substrate 1. An insulating film 10 is formed in such a way as to cover the gate 7, and a channel portion 11 for energizing the source 8 and the drain 9 is provided outside the insulating film 10. For the channel portion 11, the above-described conductive liquid-crystal material is used. Since pixels are driven by a matrix system, the gate 7 and the source 8 are connected to signal lines of x and y, respectively, and the drain 9 is connected to one pole (an anode in the present example) of the electroluminescent element.

For the conductive liquid-crystal material of the channel portion 11, the same conductive liquid-crystal material as that of the conductive liquid-crystal layer 4 of the electroluminescent element main body can be used, and be formed integrally with the conductive liquid-crystal layer 4. According to this, in an active matrix type organic electroluminescent element, the element main body and the TFT can be formed simultaneously, and a reduction of the production cost can be further facilitated.

It is preferable that the channel portion 11 and the conductive liquid-crystal material of the conductive liquid-crystal layer 4 are produced by subjecting each of the components of the above-described liquid-crystal composition to vacuum deposition or oblique vacuum deposition in a room temperature range (5° C. to 40° C.) simultaneously or separately and performing a heating and orientation treatment in an atmosphere of an inert gas, e.g., nitrogen, argon, or helium, in a temperature range suitable for a smectic liquid crystal state of the liquid-crystal composition.

Since the insulating property of a portion not heat-treated after vapor deposition on a substrate is seven orders of magnitude different from that of a portion heat-treated in terms of a conductivity, the above-described liquid-crystal composition according to an aspect of the present invention can be used as an recording medium taking advantage of that described above, and be used as a recording medium taking the advantage of the optical difference in molecular arrangement of the liquid crystal between the portion not heat-treated after vapor deposition on a substrate and the portion heat-treated. In this case, the thin film formed on the substrate from the liquid-crystal composition according to an aspect of the present invention is subjected to spot irradiation with laser light and, thereby, merely the irradiated portion is selectively brought into a smectic liquid-crystal state, so that data are committed to memory through the use of a difference in conductivity or an optical difference. Here, the above-described data recording may be performed by spots different in any one of the conductivity and optical anisotropy.

FIG. 8 is a schematic diagram showing an example in which the liquid crystal composition according to an aspect of the present invention is applied as an information memory medium to an IC chip incorporated in a card. As shown in FIG. 9, the liquid-crystal composition according to an aspect of the present invention is formed on a part of a card substrate (a) of a cash card or other various cards by, for example, subjecting each of the components to vacuum deposition or oblique vacuum deposition in a room temperature range simultaneously or separately or a thin film (b) is formed by a coating method selected from printing, a dip coating method, and a spin coating method.

Furthermore, a protective film (c) for protection is laminated on the upper surface of the above-described thin film (b), laser light (d) is applied by spot irradiation from above the above-described protective film (c) so as to perform selective heat treatment and, thereby, spots (e) in the smectic liquid-crystal state and spots (f) in the insulation state are formed on the above-described thin film (b), so that data can be recorded.

In this manner, as shown in FIG. 9, data are committed to memory on the thin film (b) by the spots (e) in the smectic liquid-crystal state exhibiting high conductivity·high optical anisotropy and the spots (f) exhibiting low conductivity·high optical anisotropy. Although not shown in the drawing here, in the case where data are committed to memory by a difference in the conductivity, electrodes can be disposed at the spots (e) and (f).

The data recorded on the above-described thin film (b) can be read by not only contact type scan which reads differences in conductivity, but also noncontact type scan based on the difference in optical anisotropy. In the liquid-crystal composition according to an aspect of the present invention, the smectic liquid crystal state is reversible, and comes into a state exhibiting low conductivity·low optical anisotropy when the molecular arrangement is disturbed by application of ultrasonic vibration or the like during cooling from a liquid state. When the spot irradiation of laser light is performed again so as to perform a selective heat treatment, it becomes possible to commit to memory again.

The information memory medium according to an aspect of the present invention can also be applied to, for example, IC tags and various cards.

EXAMPLES

The present invention will be described below in detail with reference to examples. However, the present invention is not limited to them.

Example 1

Synthesis Example 1

Distyryl Derivative (A)

Synthesis of
1,4-bis(4'-pentadecanoxystyryl)benzene-(E,E)

(1): Preparation of p-pentadecanoxybenzaldehyde

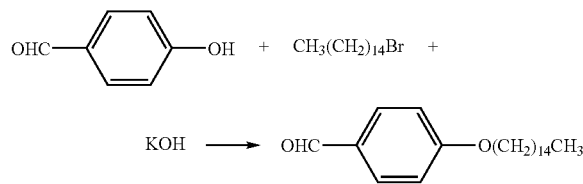

A 100-ml four-necked flask was used, 2.79 g (42.3 mM) of 85-percent by weight caustic potash was suspended in 30 ml of dimethylformamide, and 10 ml of dimethylformamide solution containing 5.28 g (43.2 mM) of hydroxybenzaldehyde was dropped thereto while being kept at 20° C. or lower. Thereafter, aging was performed at 30° C. for 1 hour. Subsequently, 9.58 g (32.9 mM) of 1-bromopentadecane was added and aging was performed at 70° C. for 21 hours. The reaction solution was dispersed into water, and extracted with toluene. After washing with water, concentration is performed so as to produce 11.03 g of slightly colored viscous liquid. Subsequently, a recrystallization treatment was performed with hexane so as to produce 8.91 g (purity 98.3%) of p-pentadecanoxybenzaldehyde.

(2): Preparation of 1,4-bis(4'-pentadecanoxystyryl)benzene Isomer Mixture (Compound (7))

A 30-ml four-necked flask was used, 7.87 g (23.7 mM) of p-pentadecanoxybenzaldehyde synthesized as described above and 8.65 g (11.0 mM) of p-xylylenebis(triphenylphosphonium bromide) were suspended in 100 ml of methanol, and 6.87 g (35.6 mM) of 28-percent by weight methylate was dropped thereto at room temperature (25° C.). Thereafter, aging was performed at a reflux temperature of 65° C. for 3 hours. Methanol was distilled out, and 200 ml of water was added to the residue, followed by agitation. Subsequently, the precipitate was filtrated. The resulting precipitate was further washed with water and acetone, followed by drying, so as to produce 7.49 g of 1,4-bis(4'-pentadecanoxystyryl)benzene isomer mixture (Compound (7)).

(Identification Data)
$^1$H-NMR:
7.45 ppm (4H, s), 7.42 (4H, d), 7.06 (2H, d), 6.94 (2H, d), 6.88 (4H, d), 3.96 (4H, t), 1.78 (4H, m), 1.2 to 1.5 (48H, m), 0.87 (6H, t)

(3): Preparation of
1,4-bis(4'-pentadecanoxystyryl)benzene-(E,E)

In a 100-ml recovery flask, 7.49 g (10.2 mM) of 1,4-bis(4'-pentadecanoxystyryl)benzene isomer mixture synthesized as described above and 20 mg (0.08 mM) of iodine were suspended in 50 ml of p-xylene, and aging with reflux was performed at 139° C. for 8 hours. After the reaction was completed, the precipitate was filtrated, followed by drying, so as to produce 7.06 g (purity 99.9%) of 1,4-bis(4'-pentadecanoxystyryl)benzene-(E,E).

(Identification Data)
$^1$H-NMR:
7.45 ppm (4H, s), 7.42 (4H, d), 7.06 (2H, d), 6.94 (2H, d), 6.88 (4H, d), 3.96 (4H, t), 1.78 (4H, m), 1.2 to 1.5 (48H, m), 0.87 (6H, t)

Synthesis Example 2

Distyryl Derivative (B)

Synthesis of
1,4-bis(4'-decanoxystyryl)benzene-(E,E)

Synthesis was performed under the same condition and reaction operations as those in Synthesis example 1 except that 1-bromopentadecane was changed to 1-bromodecane in the above-described Synthesis example 1, so as to produce 3.43 g (purity 99.9%) of 1,4-bis(4'-decanoxystyryl)benzene-(E,E) represented by the following general formula (8).

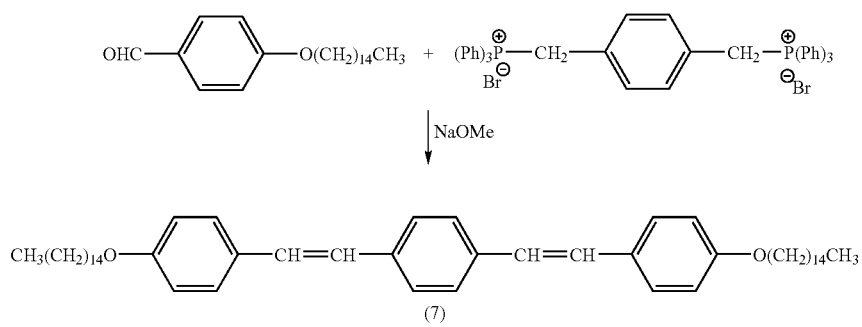

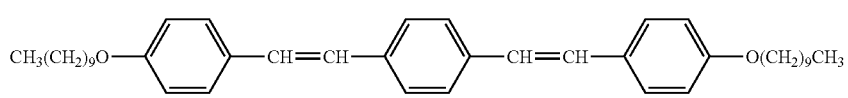

(8)

(Identification Data)

$^1$H-NMR:

7.45 ppm (4H, s), 7.43 (4H, d), 7.06 (2H, d), 6.94 (2H, d), 6.87 (4H, d), 3.98 (4H, t), 1.77 (4H, m), 1.2 to 1.5 (28H, m), 0.88 (6H, t)

The textures of the liquid-crystal phases of the distyryl derivatives produced in the above-described Synthesis example 1 and Synthesis example 2 were observed with a polarization microscope and, as a result, it was made clear that the phase transition shown in Table 1 was exhibited.

TABLE 1

| | Phase transition (° C.) |
|---|---|
| Synthesis example 1 | C 138 SmG 170 SmF 226 SmC 308 N 310 I |
| Synthesis example 2 | C 98 SmG 187 SmF 250 SmC 255 N 270 I |

Note)
C: crystal, SmG: smectic G phase, SmF: smectic F phase, SmC: smectic C phase, N: nematic, I: isotropic liquid Example 1

1-1

A glass substrate having a dimension of 2×2 mm and a thickness of 0.7 mm was mounted on a vacuum deposition apparatus, and 40 mg of mixed sample of the distyryl derivatives produced in the above-described Synthesis example 1 and Synthesis example 2 at an equal molar ratio was put in a sample boat, followed by mounting on the vapor deposition apparatus. The distance between the substrate and the sample was set at 15 cm, and vacuum deposition was performed at room temperature (25° C.) while the state of vaporization was checked by monitoring a vacuum gage. After the vapor deposition was completed, a nitrogen gas was introduced through a desiccant to return to atmospheric pressure, so as to produce a film containing a liquid-crystal composition. The resulting substrate was heat-treated at 150° C. for 3 minutes by using a substrate heating treatment apparatus, followed by natural cooling, so as to produce a conductive liquid-crystal film (film thickness: 300 nm). The transmitted light of the resulting conductive liquid-crystal film was observed with a polarization microscope and, as a result, intense transmitted light was observed. Consequently, it was ascertained that the conductive liquid-crystal film was oriented horizontally relative to the substrate even at room temperature (refer to FIG. 5).

On the other hand, in the case where the distyryl derivative (A) produced in Synthesis example 1 was used alone or the distyryl derivative (B) produced in Synthesis example 2 was used alone, merely weak transmitted light was observed. Therefore, it was ascertained that not many liquid crystals were oriented horizontally relative to the substrate.

The phase transition of the film containing the above-described liquid-crystal composition (Synthesis example 1+Synthesis example 2) is shown in Table 2.

TABLE 2

| | Phase transition (° C.) |
|---|---|
| Liquid-crystal composition | C 90 SmG 120 SmF 210 SmC 225 N 231 I |

Note)
C: crystal, SmG: smectic G phase, SmF: smectic F phase, SmC: smectic C phase, N: nematic, I: isotropic liquid 1-2

An ITO film (reference numeral 2 as shown in FIG. 1) having a thickness of 160 nm was formed by a sputtering method on a glass substrate (reference numeral 1 as shown in FIG. 1) having a dimension of 2×2 mm and a thickness of 0.7 mm. PEDOT-PSS (poly(3,4-ethylenedioxythiophene)-polystyrene sulfonate) was applied thereon by spin coating, and unnecessary portions on the substrate were removed by using isopropanol. Thereafter, a heat treatment was performed at 150° C. for 30 minutes to cure PEDOT-PSS, so that a PEDOT-PSS film (film thickness 0.1 μm, reference numeral 3 as shown in FIG. 1) was produced.

Subsequently, the resulting substrate was mounted on a vacuum deposition apparatus, and 40 mg of mixed sample of the distyryl derivatives produced in the above-described Synthesis example 1 and Synthesis example 2 at an equal molar ratio was put in a sample boat, followed by mounting on the vapor deposition apparatus. The distance between the substrate and the sample was set at 15 cm, and vacuum deposition was performed at room temperature (25° C.) while the state of vaporization was checked by monitoring a vacuum gage. After the vapor deposition was completed, a nitrogen gas was introduced through a desiccant to return to atmospheric pressure. The resulting substrate was heat-treated at 150° C. for 3 minutes or was heat-treated at 200° C. for 3 minutes by using a substrate heating treatment apparatus, followed by natural cooling, so as to produce a conductive liquid-crystal layer (film thickness: 300 nm, reference numeral 4 as shown in FIG. 1).

An aluminum metal cathode (reference numeral 5 as shown in FIG. 1) was formed thereon by a vacuum deposition method. The thickness of the cathode was 100 nm.

The amount of current of this element was measured at 25° C. on a voltage basis. The results related to the heat treatment at 150° C. for 3 minutes are shown in FIG. 6, and the results related to the heat treatment at 200° C. for 3 minutes are shown in FIG. 7.

An element was formed in a manner similar to the operations described above except that the conductive liquid-crystal film prepared in Example 1 was not heat-treated. The amount of current of the resulting element was measured at 25° C. on a voltage basis. The results thereof are also shown in FIG. 6 and FIG. 7.

As is clear from the results shown in FIG. 6 and FIG. 7, the conductive liquid-crystal material according to an aspect of the present invention exhibits excellent conductivity at a low threshold voltage of about 5 V even in a room temperature range (25° C.), the non-treatment liquid-crystal composition, which has not been heat-treated, according to an aspect of the present invention has a feature of maintaining the insulating property, but when a heat treatment is performed, the conductivity is about seven orders of magnitude improved relative to that in the case of no heat treatment, and furthermore, the exhibited features include that the value of resistance varies with an applied voltage and the current density rises sharply at a voltage of about 5 V.

Moreover, fluorescent spectrum of this element was observed in a dark place and, as a result, blue-light emission was observed.

1-3

A substrate was provided with a gold drain electrode (reference numeral 9 as shown in FIG. 3), a gold source electrode (reference numeral 8 as shown in FIG. 3), and a silicon gate electrode (reference numeral 7 as shown in FIG. 3), and 40 mg of mixed sample of the distyryl derivatives produced in the above-described Synthesis example 1 and Synthesis example 2 at an equal molar ratio was put in a sample boat, followed by mounting on the vapor deposition apparatus in such a way as to become oblique relative to the substrate. The distance between the substrate and the sample was set at 15 cm, and oblique vacuum deposition was performed at room temperature (25° C.) while the state of vaporization was checked by monitoring a vacuum gage. After the vapor deposition was completed, a nitrogen gas was introduced through a desiccant to return to atmospheric pressure. The resulting substrate was heat-treated at 150° C. for 3 minutes by using a substrate heating treatment apparatus, followed by natural cooling, so that, a good conductive liquid-crystal layer (reference numeral 11 as shown in FIG. 3) was able to be formed.

1-4

The distyryl derivatives produced in the above-described Synthesis example 1 and Synthesis example 2 were mixed at a molar ratio of 1:1. With respect to the charge transport characteristic (measurement of mobility) of the resulting liquid-crystal composition, the charge transfer rates at various temperatures were measured by a Time-of-Flight (TOF) method. The results thereof are shown in Table 3. With respect to the measurement condition, the electrode material for both the anode and the cathode was ITO, the distance between electrodes was 9 μm, the area of electrode was 0.16 cm$^2$, and the irradiation wavelength was 337 nm.

TABLE 3

| Measurement temperature(° C.) | Charge mobility (cm$^2$/V · s) |
|---|---|
| 150 | $1.7 \times 10^{-2}$ |
| 80 | $2.7 \times 10^{-2}$ |
| 40 | 0.4 |

It is believed from the results shown in Table 3 that according to the conductive liquid-crystal material of the mixture system of the present invention, the intermolecular order of liquid crystal is maintained up to a temperature close to the room temperature, the intermolecular order of liquid crystal can be fixed as it is at a temperature close to the room temperature, at which the molecular motion is at a low level, and thereby, the mobility of charge and the amount of transport of charge are increased as compared with those of a known organic semiconductor material even at a temperature close to the room temperature.

INDUSTRIAL APPLICABILITY

The liquid-crystal composition according to an aspect of the present invention has a feature of maintaining the insulating property. The conductive liquid-crystal material produced by treating the liquid-crystal compound, according to an aspect of the present invention, has features including that, for example, the threshold voltage is a low voltage of about 5 V even in a room temperature range, excellent conductivity about 10 million times or more as large as that in the case of non-treatment is exhibited, the value of resistance varies with an applied voltage, the current density rises sharply at a voltage of about 5 V, and an excellent charge mobility is exhibited. The above-described conductive liquid-crystal material is useful as, for example, a memory element taking advantage of the fact that the insulating property of a portion not heat-treated after vapor deposition on a substrate is seven orders of magnitude different from that of a portion heat-treated in terms of a conductivity, a memory element taking the advantage of the optical difference in molecular arrangement of the liquid crystal between the portion not heat-treated after vapor deposition on a substrate and the portion heat-treated, an organic electroluminescent element, or a thin film transistor element.

The invention claimed is:

1. A conductive liquid-crystal material characterized by comprising a liquid-crystal composition composed of at least two components having a smectic phase as a liquid-crystal phase, wherein at least two components are selected from distyryl derivatives represented by the following general formula (1) and the liquid-crystal composition comes into a solid state formed by a phase transition from the smectic phase:

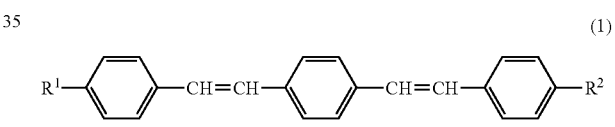

(1)

(In the formula, R$^1$ and R$^2$ independently represent a linear or branched alkyl group, and R$^1$ and R$^2$ may be the same group or different groups).

2. The conductive liquid-crystal material according to claim 1, wherein the liquid-crystal composition contains at least two components which are compounds selected from the distyryl derivatives represented by the general formula (1), the lengths of alkyl chains of the compounds being different from each other.

3. The conductive liquid-crystal material according to claim 1, wherein the liquid-crystal phase of the liquid-crystal composition takes on a smectic phase in a temperature range of 100° C. to 250° C.

4. The conductive liquid-crystal material according to claim 1, wherein the liquid-crystal composition has been formed into a layer by a vacuum deposition method, an oblique vacuum deposition method, or a coating method selected from printing, a dip coating method, and a spin coating method for applying the liquid-crystal composition with a solvent.

5. The conductive liquid-crystal material according to claim 1, wherein the solid state formed by a phase transition from the smectic phase is obtained by heat-treating the liquid-crystal composition at 100° C. to 250° C. and, thereafter, lowering the temperature.

6. A process for producing a conductive liquid-crystal material comprising the steps of heat-treating a liquid-crystal composition composed of at least two components having a smectic phase as a liquid-crystal phase, at least two components are being selected from distyryl derivatives represented by the general formula (1), in a temperature range suitable for a smectic liquid crystal state and lowering the temperature wherein $R^1$ and $R^2$ are independently represent a linear or branched alkyl group, and $R^1$ and $R^2$ may be the same group or different group.

(1)

7. A liquid-crystal composition characterized by comprising at least two components having a smectic phase as a liquid-crystal phase, wherein at least two components are selected from distyryl derivatives represented by the general formula (1) wherein $R^1$ and $R^2$ are independently represent a linear or branched alkyl group, and $R^1$ and $R^2$ may be the same group or different group.

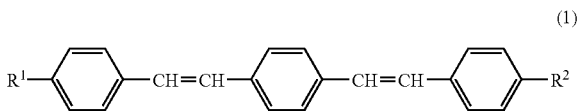

(1)

8. A liquid-crystal semiconductor element characterized by comprising the conductive liquid-crystal material according to any one of claims 1 to 5.

9. The liquid-crystal semiconductor element according to claim 8, wherein the conductive liquid-crystal material is produced by subjecting each of the components to vacuum deposition or oblique vacuum deposition in a room temperature range simultaneously or separately and performing a heating and orientation treatment in an inert gas atmosphere in a temperature range suitable for a smectic liquid crystal state of the liquid-crystal composition.

10. The liquid-crystal semiconductor element according to claim 8, wherein the liquid-crystal semiconductor element is used for an organic electroluminescent element or a thin film transistor element.

11. An information memory medium characterized by comprising the liquid-crystal composition according to claim 7.

12. The information memory medium according to claim 11, wherein the information memory medium commits data to memory on the basis of a difference in optical anisotropy.

13. The information memory medium according to claim 11, wherein the information memory medium commits data to memory on the basis of a difference in conductivity.

14. The information memory medium according to claim 11, wherein the information memory medium commits data to memory with a laser spot heating device by using a thin film formed from the liquid-crystal composition.

15. The conductive liquid-crystal material according to claim 1, wherein the at least two components selected from distyryl derivatives represented by the formula (1) have alkyl chain lengths different from each other.

16. The conductive liquid-crystal material according to claim 15, wherein the at least two compounds having alkyl chain lengths different from each other, each have $R^1$ and $R^2$ with a carbon number of 3 to 18.

* * * * *